(12) United States Patent
Huang et al.

(10) Patent No.: US 6,930,049 B2
(45) Date of Patent: Aug. 16, 2005

(54) ENDPOINT CONTROL FOR SMALL OPEN AREA BY RF SOURCE PARAMETER VDC

(75) Inventors: Jiaming Huang, Plano, TX (US); Ming Yang, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 122 days.

(21) Appl. No.: 09/921,382

(22) Filed: Aug. 2, 2001

(65) Prior Publication Data

US 2002/0025685 A1 Feb. 28, 2002

Related U.S. Application Data

(60) Provisional application No. 60/227,549, filed on Aug. 24, 2000.

(51) Int. Cl.[7] .............................................. H01L 21/302
(52) U.S. Cl. .............................. 438/714; 438/9; 438/10; 438/706; 216/61
(58) Field of Search .......................... 438/5, 9, 10, 706, 438/710, 714, 712, 720, 14; 216/58, 59, 61, 57

(56) References Cited

U.S. PATENT DOCUMENTS 5,856,239 A * 1/1999 Bashir et al. ............... 438/738
6,228,278 B1 * 5/2001 Winniczek et al. ........... 216/61

* cited by examiner

Primary Examiner—Lan Vinh
(74) Attorney, Agent, or Firm—Yingsheng Tung; Wade James Brady, III; Frederick J. Telecky, Jr.

(57) ABSTRACT

A method of detecting endpoint of a plasma etching system that measures the DC voltage drop across both the sheath and the film being etched. When the film is nearly removed, a drop in voltage indicates thinning of the film which detects endpoint for etching before optical emission techniques. The voltage drop is measured across resistors within the matching network.

6 Claims, 3 Drawing Sheets

ENDPOINT CONTROL FOR SMALL OPEN AREA BY RF SOURCE PARAMETER VDC

This application claims priority under 35 USC § 119(e)(1) of provisional application No. 60/227,549 filed Aug. 24, 2000.

BACKGROUND AND SUMMARY OF THE INVENTION

The present invention relates to integrated circuit fabrication, specifically to plasma etching processes.

Background: Plasma Etching

Integrated circuit fabrication technology has evolved rapidly in recent years. The demand for smaller devices has required features in wafer fabrication to shrink to extremely fine sizes. Plasma etching has grown into one of the more commonly used fabrication processes because of its ability to etch small sizes with controllable selectivity and anisotropy.

Simple plasma reactors consist of parallel plate capacitors in a chamber that can be maintained at low pressure. A high frequency voltage is applied between the electrodes, and current flows which dissociates a gas, ionizing a small number of its molecules to form a plasma. For most etching processes, the extent of ionization is very small, on the order of one particle per 100,000 or 1,000,000. Reactive radicals are produced by the electrical discharge. The positive charge consists mostly of singly ionized neutrals which have lost a single electron. The majority of negative charged particles are free electrons, though in very electronegative gases negative ions can be more abundant.

During etching, semiconductor wafers on the electrode surface are exposed to the reactive neutral and charged species. Some of these species combine with the substrate material to form volatile products that evaporate, etching the substrate while leaving other materials (the mask, for instance) relatively unaffected. Plasma etching can thus selectively remove films while masks and underlying materials are not etched.

Though plasma etching is capable of etching patterns with the necessary resolution, the process must be strictly controlled in order to produce consistently high quality patterns. With the rapid decrease of feature size of semiconductor devices, multi-layer interconnect technology becomes both critical to the success of process and design and challenging technologically. Specifically, processes such as oxide etch should be reliable, have good throughput, and have precisely controllable performance.

Fluorine/carbon based chemistry at low pressure and high density plasma sources are used to produce higher etch rate and higher aspect ratio etch capabilities. In this type of system, F/C ratio is a key factor in etch performance. Etching must last long enough to completely remove the desired material layer, but must not excessively overetch and thus cause damage to underlying structures and materials.

Endpoint detection for etching processes is therefore very important. Etching occurs at optimized and balanced levels, and these balances can indicate when etching has proceeded to materials beyond the intended etch materials. So, for example, when an etchant fully etches an oxide layer, and begins to interact with the nitride beneath, these balances are disturbed. Such changes in the plasma system are used to determine the proper time to cease etching.

Endpoint can be determined in a number of ways. One common method for determining endpoint is through spectral emissions of reactant gases in the plasma chamber. The intensities of spectra emitted by the gases change whenever the electrical and chemical conditions in the system change. Such changes occur when a desired layer is fully etched, exposing the underlying layer. When the etched layer is fully removed, its contribution to the system changes, and its spectrum intensity reflects this change. By monitoring these spectral emissions, an endpoint for etching can be determined. However, for small open areas, such methods decrease in effectiveness because smaller open areas means smaller spectral differences when a particular layer is fully etched. Thus the changes in plasma system conditions are more difficult to detect using small open area and optical emission spectra.

Another method of determining endpoint includes monitoring the voltage across the sheath region of the plasma. The DC bias changes during the resist strip cycle, and reaches a maximum when the etched film begins to clear. This type of monitoring usually requires a probe placed inside the plasma chamber to measure voltage changes. Such probes are not only difficult to include in the process, they alter the process themselves and must be accounted for in the plasma system. They also share a disadvantage with optical systems in that the etching cycle must be completed before the signal for endpoint is generated. This increases the risk of overetch.

Endpoint Control for Small Open Area by RF Source Parameter

The present application discloses monitoring a DC component of the impedance matching network to determine a stopping point for plasma etching. The innovative endpoint detection system operates by monitoring the voltage change across a resistor in the matching network. The voltage drop in the resistor is proportional to the total DC voltage of the plasma system. Thus changes in the plasma DC voltage are indirectly monitored to determine an endpoint for etching.

This indirect method of monitoring the plasma DC parameters allows easier endpoint detection than typical DC bias monitoring methods. Instead of in-situ monitoring via probes, a simple voltmeter added to the matching circuit can indicate etch endpoint. This method works even for small open area percentages and indicates changes in the process earlier than optical emission spectrum endpoint detection schemes.

Advantages of the disclosed methods and structures, in various embodiments, can include one or more of the following:

endpoints for small open areas may be detected;
endpoint signaled before optical emission spectrum signals endpoint;
implementation with minor changes to existing systems.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
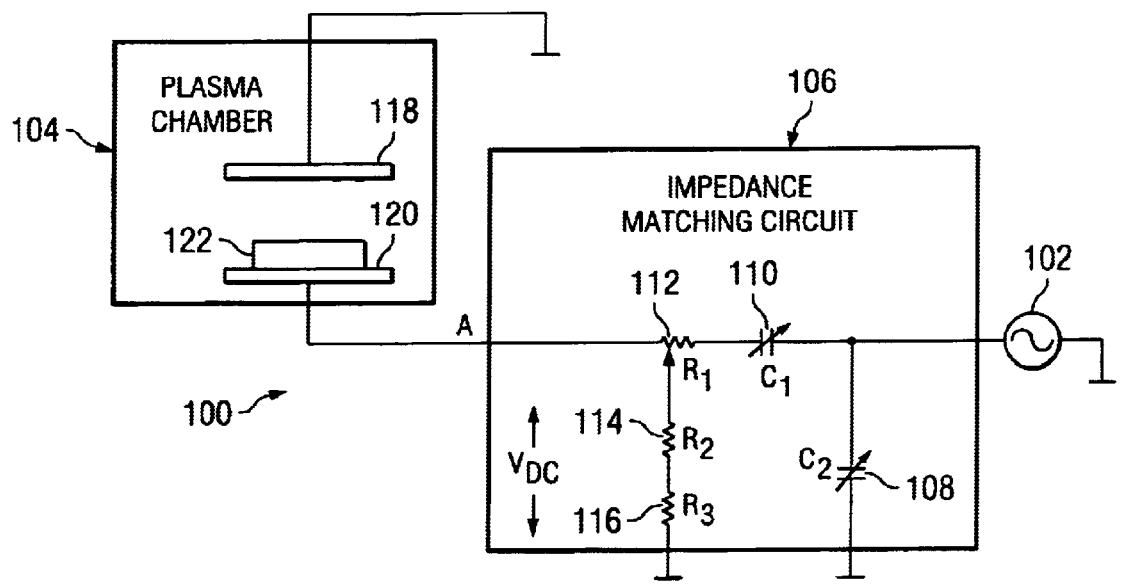
FIG. 1 shows a plasma etching system for IC fabrication.

FIG. 1 shows a plasma etching system 100 for semiconductor wafers. The system includes an RF source 102 powering a plasma etching system 104. An impedance matching network 106, consisting of variable capacitors 108, 110 and resistors 112, 114, 116, connects the source 102 to the plasma system 104. The plasma system 104 includes two electrodes 118, 120 in a chamber.

During fabrication, a wafer 122 is placed on electrode 120. The wafer 122 has a resist mask of a pattern to be etched. The RF source 102 applies an alternating electric field to the gas in the chamber, varying the voltage of the plates 118, 120. This causes the gas to go plasma (with the addition of a process gas). The plasma etches the surface of the wafer 122.

In order to maintain maximum power output, the matching circuit 106 is used to match the impedances of the RF source 102 and the plasma system 104.

The circuit in FIG. 1 shows how the Vdc signal from the plasma system is measured. Any shift in chamber condition, either electrical or chemical, will cause a resulting change in the matching network 106. Such changes will cause the matching circuit 106 to adjust its C1 and C2 settings to match the shift and minimize the reflected RF power. Thus changes in plasma parameters are reflected in the impedance and phase of the RF system, including the matching network 106.

Figure 2:
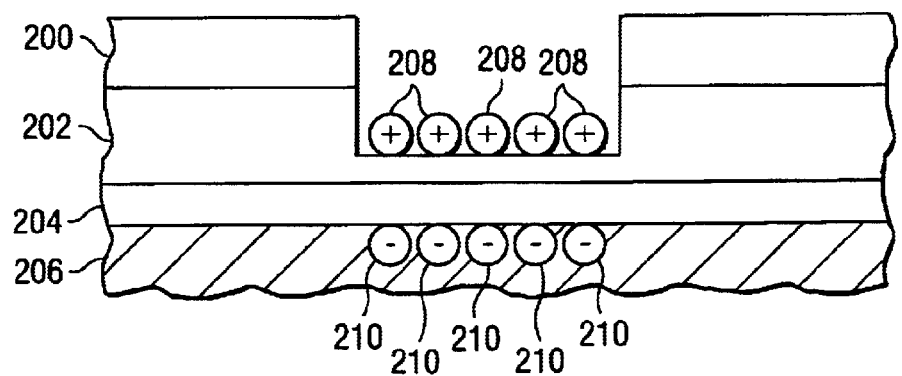
FIG. 2 shows a detail of a hole during the etching process.

As etching proceeds, the DC voltage across the plasma system 104 changes. This DC shift is caused by both a change in the sheath voltage and by change in the thickness of the oxide layer that is being etched. Refer to FIG. 2. a mask 200 covers an oxide layer 202 to control etching of the oxide. Beneath the oxide layer is a nitride layer 204, followed by a substrate 206. As the oxide layer 202 becomes thinner, the charge 208 deposit on the surface of the etched oxide 202 attracts charge 210 from the far side of the nitride 204 to form a capacitance. As the oxide layer 202 thins, this capacitance changes. The change in the system is reflected in the voltage across resistors within the matching circuit that are connected between the high node of the plasma chamber and ground.

It is believed to be particularly advantageous to measure the DC voltage from a resistor rather than from a capacitor. Discrete resistors normally include a substantial parasitic inductance. (By contrast, in a discrete capacitor, any inductive reactive component due to the parasitic inductance of leads or wiring will be cancelled by the capacitive reactance.)

In FIG. 1, two resistors 114, 116 are shown between node A and ground. Since endpoint is signalled by a relative in change of Vdc, a voltage drop across either or both resistors 114, 116 will serve as an endpoint detection signal. A simple multimeter (not shown) can thus be used to detect endpoint without adding hardware or the need for a probe within the plasma system itself.

This innovative method of endpoint detection shows significant change in the measured Vdc parameter even with small percentage open areas. Also, early endpoint detection is possible because the capacitance of the plasma model depends on the thickness of the oxide layer. Since the endpoint signal relies on an indicator that shows change before the etched layer is completely gone, the endpoint detection can be signaled before etching is complete.

Experimental Results

Experimental data were gathered using DRM (dual-plate rotating magnet) chambers on TEL Unity II Frame. The chamber is equipped with SiC focus ring, slit baffle, and lower pressure monitor. Plasma parameters are measured by measurements circuits within the matchbox. In the preferred embodiment fluorine/carbon based chemistry, such as $CO/C_4F_8/Ar$ or $C_4F_8/CHF_3/O_2/Ar$, is used because carbon and fluorine concentration can be tuned easily across a large range.

The pilot wafers used in the experiment had a structure of PSG/Nitride stack with contact pattern and open area percentages of 10%, 4%, and 1%. A 30 nm nitride stop layer is beneath 6.5K PSG (phosphorous-doped silicate glass) film. High nitride selectivity (Oxide:Nitride=7:1) is used to prevent extensive etching of the nitride layer.

Figure 3:
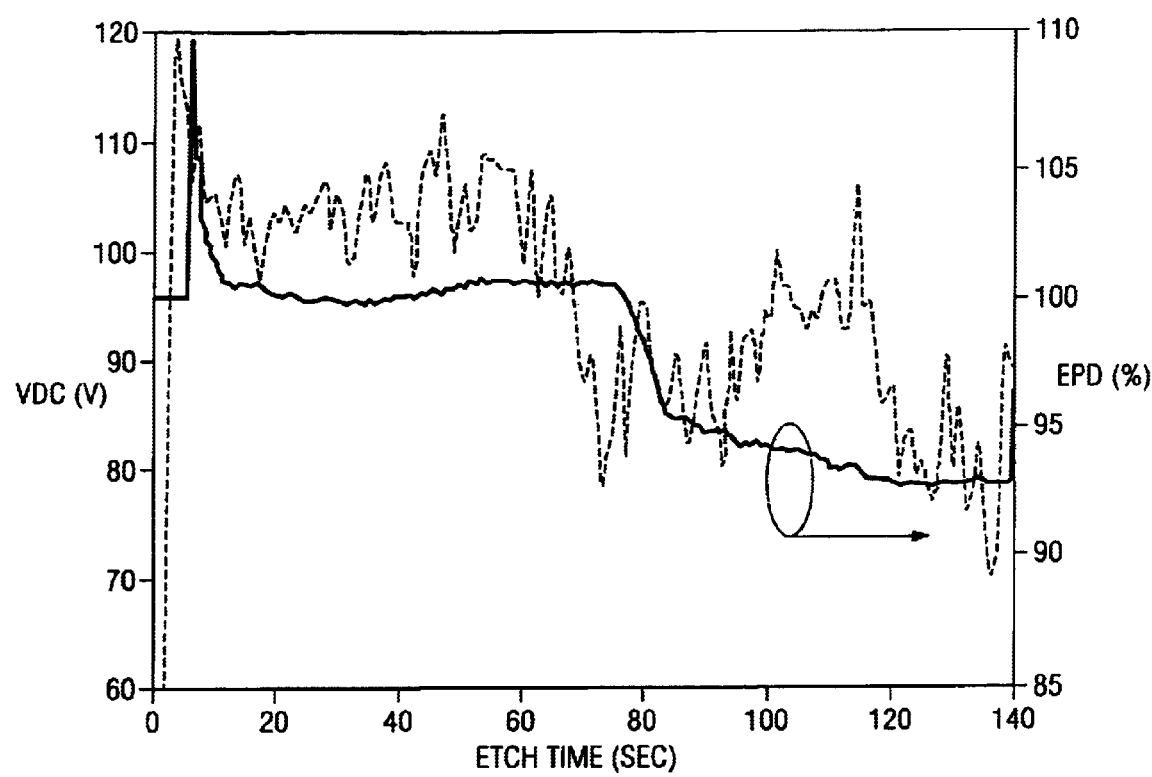
FIGS. 3–5 show graphs comparing optical endpoint detection with Vdc endpoint detection.
Figure 4:
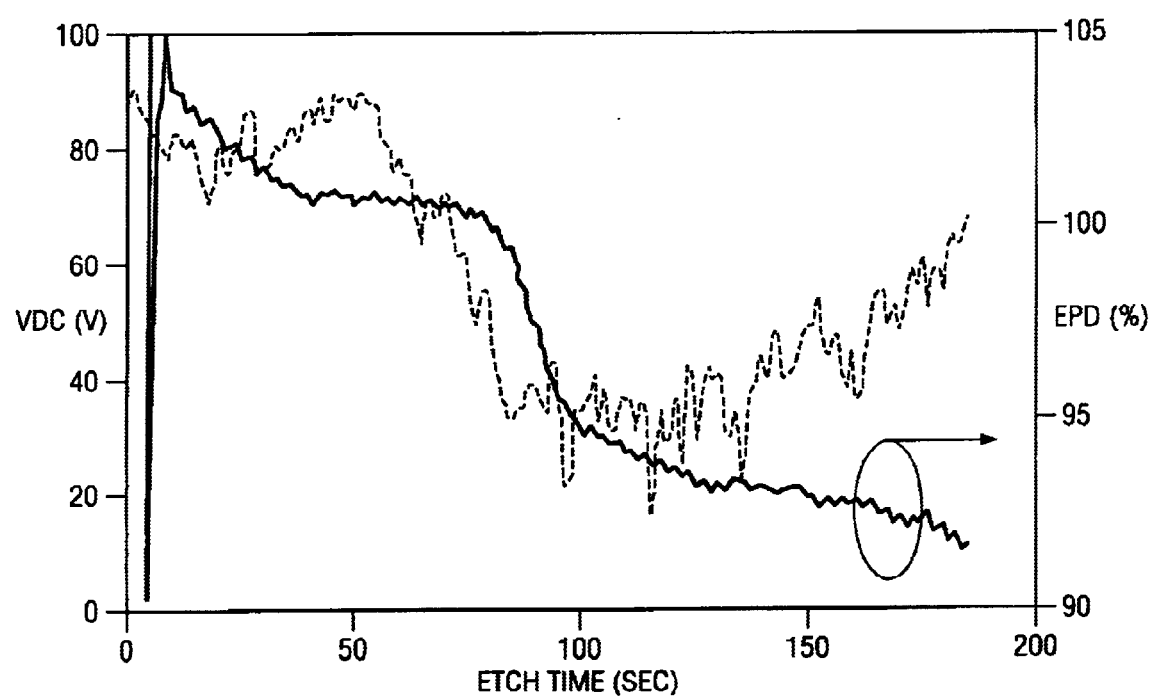
Figure 5:
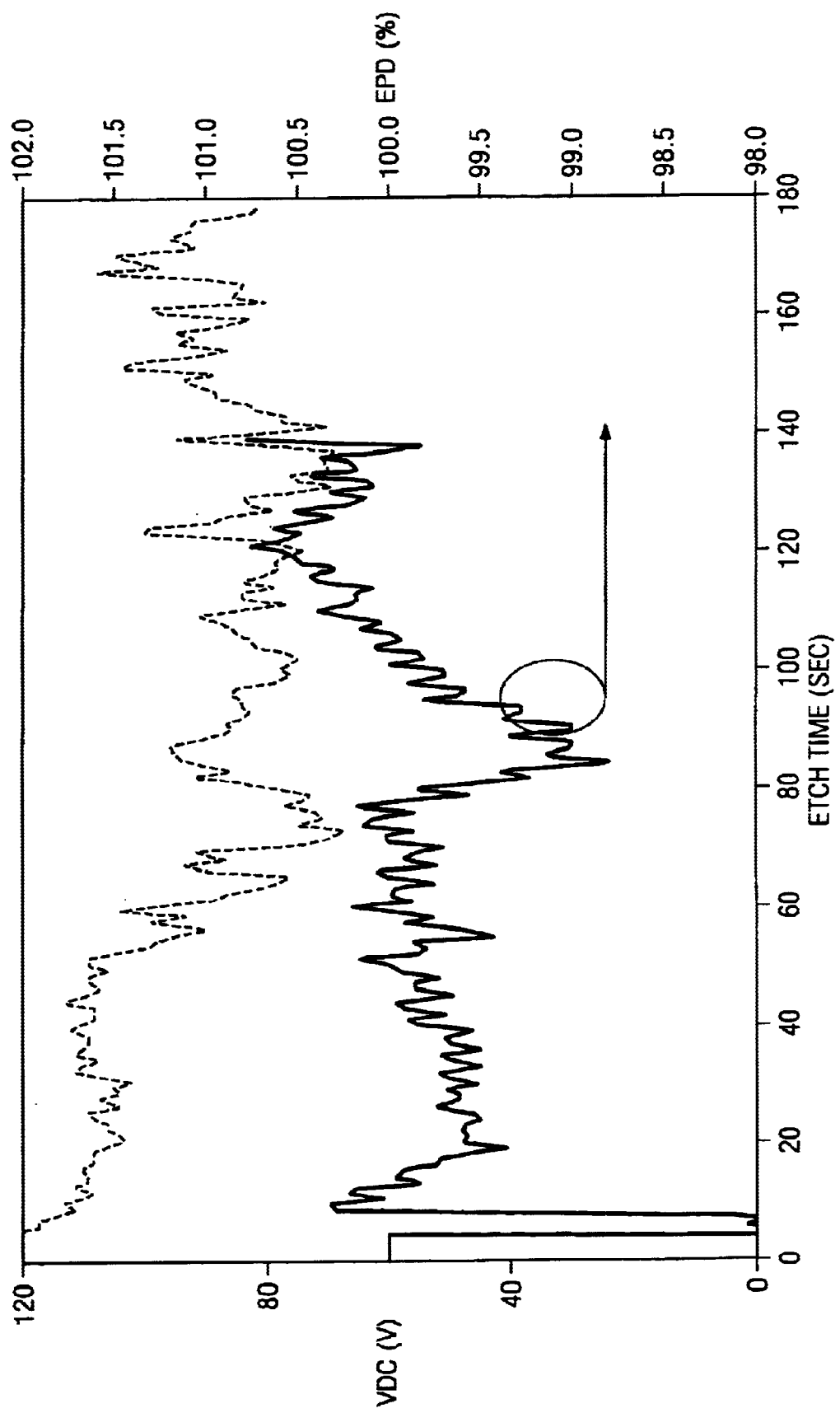

FIGS. 3–5 show the signals for both optical emission spectrum and Vdc endpoint detection. Both curves are normalized, and smoothing techniques have been applied to the OES signal but not to the Vdc signal.

Measuring the end point through monitoring Vdc shows the same trends as appear in optical methods. In Vdc monitoring, the endpoint step is triggered by a change in voltage drop across a resistor positioned to measure total DC voltage drop across the plasma system. Since this change in the plasma system occurs before the change causing emission spectrum signal changes, the Vdc signal provides endpoint detection before optical methods.

The change in Vdc output as measured from the matching circuit occurs before the optical emission change because different mechanisms in the plasma system cause the changes. For optical emission spectra to change, the actual material that is being etched changes because the oxide layer has been breached and the underlying nitride layer adds its material to the reacting gases in the plasma chamber.

As can be seen from FIG. 3, the emission spectrum for optical endpoint detection is a much smoother curve, and a sharp decrease is found at approximately 80 seconds. The Vdc data produce a less smooth plot, but a clear drop is seen ahead of the optical endpoint indication, as early as 65 seconds.

The OES endpoint detection is shown as intensity ratios of emission spectra from CO and SiF. When the etch front reaches the nitride layer, CO increases and SiF decreases, causing a change in the intensity ratio. This change is seen on the graph as a drop at about 80 seconds on FIG. 3. A 5% step drop in the signal is seen on a 10% open area sample. As open area decreases, the signal-to-noise ratio gets worse as seen in FIGS. 4 and 5. FIG. 4 used a sample with open area of 4% and FIG. 5 used an open area of 1%. The signal indication is difficult to read at smaller open areas and OES is difficult to use as endpoint control for open areas of 1%. Smoothing techniques near their limits for OES signals.

The signals for both OES and Vdc endpoint detection decrease in step size with decrease in open area. With large open area (greater than 10%) the chemistry in the chamber changes significantly when the oxide layer is finally etched through and the nitride layer is exposed. The electrical properties of the plasma adjust to reflect this change, and the matching circuit therefore also shows significant change. With decreasing open area, the changes become smaller. The reason for this is because the plasma electrical properties are strongly a function of the reactive chemical species. With smaller open areas, the reactive species concentrations differ less when layers are fully etched.

Charging of the nitride layer as the oxide layer thins enhances the Vdc signal, but not the optical signal. Therefore measuring Vdc will allow endpoints for smaller open areas to be detected. The plots also show that the change occurs prior to completion of oxide etching, allowing proactive endpoint triggering.

The step in Vdc ends before the beginning of the optical signal, showing that Vdc signals before the etch reaches the nitride layer. Vdc signal begins when there is about 50–80 nm oxide thickness remaining.

Note that the measurement of the DC voltage across the plasma system is not necessarily dependent on the impedance matching circuit. The resistor could be placed outside the matching box to directly measure the voltage drop from a node common to the top (ungrounded) plate of the plasma system to ground. Also since only relative voltage drop need be determined, one of several such resistors in series from the top node of the chamber to ground could be measured to give the endpoint signal.

Definitions:

Following are short definitions of the usual meanings of some of the technical terms which are used in the present application. (However, those of ordinary skill will recognize whether the context requires a different meaning.) Additional definitions can be found in the standard technical dictionaries and journals.

OES: Optical Emission Spectrum. This is a method of endpoint detection based on measuring the emission spectra of etchants, etch products, or their fragments. Optical instruments are set to detect a spectral line of interest and track its intensity during an etch cycle. Endpoint is determined by a particular shift in intensity.

Matching Circuit: A circuit that matches the source and load impedances to maintain optimum power output.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

The innovations of the present application may be implemented by measuring the relevant voltage of the plasma chamber in other ways. For instance, a resistor outside the matching network can also give the necessary voltage change and indicate endpoint for the etch.

Similarly, other embodiments of the present application's teachings may include measuring voltage drop across other elements of the matching network, or across other elements that are in contact with the system, provided they give an indication of DC voltage changes within the plasma system. For instance, DC voltage drop may be measured from different nodes to ground, or across elements other than resistors.

The present innovations may also be used to indicate a change in etch parameters, not just the proper time to stop the etch. Where successive etches or stack etches are performed and require distinguishing between levels of material, the different phases of such etching may be determined by the innovative methods of the present application. Other process parameters that must be detected and which are detectable in the presently disclosed innovative way are also within the contemplation of the present application.

Additional general background, which help to show the knowledge of those skilled in the art regarding variations and implementations of the disclosed inventions, may be found in the following documents, all of which are hereby incorporated by reference: Coburn, PLASMA ETCHING AND REACTIVE ION ETCHING (1982); HANDBOOK OF PLASMA PROCESSING TECHNOLOGY (ed. Rossnagel); PLASMA ETCHING (ed. Manos and Flamm 1989); PLASMA PROCESSING (ed. Dieleman et al. 1982); and the semiannual conference proceedings of the Electrochemical Society on plasma processing.

What is claimed is:

1. A method of endpoint detection in plasma etching of a target layer of material, comprising the actions of:

providing a target layer of material of which not less than 90% of the target layer surface is covered with a mask;

etching the less than 10% open area of the target layer uncovered by the mask;

measuring voltage across a plasma system by measuring a voltage across an element that is external to said plasma system;

detecting a change of the voltage prior to the completion of the etching of the target layer of material; and stopping etch when said voltage decreases a predetermined amount within a predetermined time.

2. The method of claim 1, wherein said element is a resistor.

3. The method of claim 1, wherein said voltage is a DC voltage.

4. The method of claim 1, wherein the element is part of an impedance matching network.

5. The method of claim 1, wherein the not less than 90% of the target layer surface is not less than 96%.

6. The method of claim 1, wherein the not less than 90% of the target layer surface is not less than 99%.

* * * * *